United States Patent
Yee

(10) Patent No.: US 6,529,057 B2
(45) Date of Patent: Mar. 4, 2003

(54) STRETCHING, SHORTENING, AND/OR REMOVING A CLOCK CYCLE

(75) Inventor: Gin S. Yee, Sunnyvale, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/834,137

(22) Filed: Apr. 12, 2001

(65) Prior Publication Data

US 2002/0149411 A1 Oct. 17, 2002

(51) Int. Cl.[7] .............................................. H03K 3/017
(52) U.S. Cl. ....................... 327/172; 327/173; 327/174; 327/175
(58) Field of Search ................................. 327/172, 173, 327/174, 175, 176, 270, 271, 272, 276, 277, 293, 298, 299

(56) References Cited

U.S. PATENT DOCUMENTS

| | | | | |
|---|---|---|---|---|
| 5,389,843 A | * | 2/1995 | McKinney | .................. 327/276 |
| 5,430,394 A | * | 7/1995 | McMinn et al. | ............. 327/292 |
| 5,574,866 A | * | 11/1996 | Smith et al. | ................. 395/285 |
| 5,646,564 A | * | 7/1997 | Erickson et al. | ............. 327/158 |
| 6,157,236 A | * | 12/2000 | Rajivan et al. | ............. 327/276 |

* cited by examiner

Primary Examiner—Timothy P. Callahan
Assistant Examiner—An T. Luu
(74) Attorney, Agent, or Firm—Rosenthal & Osha L.L.P.

(57) ABSTRACT

A method and apparatus for stretching and/or shortening a clock cycle uses a multiplexor stage, in which a multiplexor switches between a normal clock signal and a delayed clock signal. Further, a method and apparatus for generating a plurality of stretched and/or shortened clock cycles uses a multiplexor stage in which a multiplexor successively switches between a normal clock signal and a plurality of delayed clock signals. Further, a method and apparatus for removing a clock cycle uses a multiplexor stage, in which a multiplexor switches between either a normal clock signal or a delayed clock signal and a grounded signal.

60 Claims, 3 Drawing Sheets

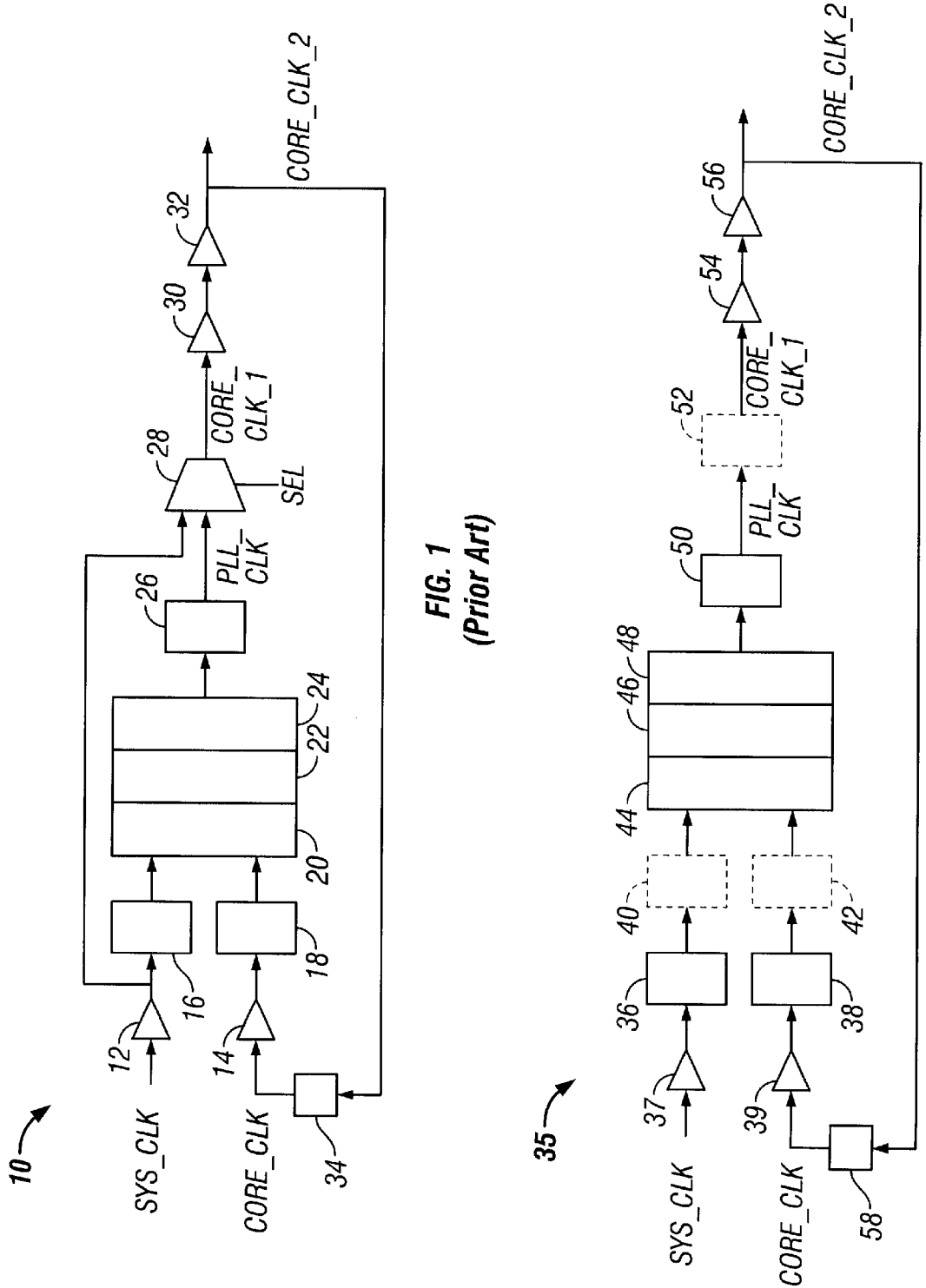

STRETCHING, SHORTENING, AND/OR REMOVING A CLOCK CYCLE

BACKGROUND OF INVENTION

Background Art

A typical computer system includes a system clock that is used as a time reference by system components to perform operations. However, computer chips, such as microprocessors, need a time reference, i.e., a core clock signal, that has a significantly greater frequency than that of the system clock because computer chips generally operate at much faster speeds than other system components. In order to generate a core clock signal that has a greater frequency than the system clock, computer systems typically include a clock generator component, such as a phased-lock loop ("PLL").

A PLL, which is often used to control the frequency and/or phase of a signal, is a system that uses feedback to maintain an output signal in a specific phase relationship with a reference signal. The phase relationship between two signals is the amount of phase difference (also referred to as "phase margin") between those two signals. The phase of a signal is the fraction of a period that has elapsed in a periodic function, e.g., a core clock signal, measured from some fixed origin. By maintaining a specific phase relationship, e.g., a phase margin of 0, the core clock signal generated by the PLL can be aligned with the system clock such that the start of a core clock signal cycle occurs at the start of a system clock cycle. Therefore, a functional objective of the PLL is to generate a core clock signal from a system clock and maintain a specific phase difference between the two signals such that the core clock signal generated by the PLL is aligned with the system clock.

FIG. 1 shows a prior art embodiment of a PLL (10). The PLL (10) includes a first buffer (12) that inputs a system clock, SYS_CLK. The first buffer (12) restores SYS_CLK to "full swing" such that any voltage dissipation or stray voltage addition to SYS_CLK present at the input of the first buffer (12) is removed at the output of the first buffer (12). For example, SYS_CLK may be desired to cycle between 0 and 5 volts. However, due to system conditions, e.g., current leakage and/or voltage dissipation, SYS_CLK may only cycle between 0 and 4.5 volts at the input of the first buffer (12). The first buffer (12) then inputs SYS_CLK and restores SYS_CLK such that the first buffer (12) outputs a restored SYS_CLK signal that cycles between 0 and 5 volts.

The PLL (10) also includes a second buffer (14) that inputs a core clock signal, CORE_CLK. The second buffer (14) restores CORE_CLK, in essentially the same manner as the first buffer (12) restores SYS_CLK.

The first buffer (12) outputs the restored (also referred to as "buffered") SYS_CLK signal to a first clock divider (16) and the second buffer (14) outputs the restored (also referred to as "buffered") CORE_CLK signal to a second clock divider (18). The first clock divider (16) contains dividers and/or counters that divide SYS_CLK down, i.e., SYS_CLK's frequency decreases. As opposed to the first clock divider (16), which resides in a feed forward path of the PLL (10), the second clock divider (18) resides in a feedback path of the PLL (10). Accordingly, the second clock divider (18) divides down CORE_CLK. However, those skilled in the art will appreciate that because the second clock divider (18) resides in the feedback path of the PLL (10), the dividing down of CORE_CLK actually results in the multiplying of CORE_CLK, i.e., CORE_CLK's frequency increases.

The SYS_CLK signal and the CORE_CLK signal generated by the first clock divider (16) and the second clock divider (18), respectively, serve as inputs to a phase-frequency detector ("PFD") (20). The PFD (20) contains a device that produces two output pulses (not shown). The difference in pulse widths between the two output pulses from the PFD (20) is proportional to the phase difference of the two input signals to the PFD (20). The two output pulses produced by the PFD (20) then serve as inputs to a charge pump ("CP") (22). The CP (22), depending on the difference in pulse widths between its inputs, precharges or dumps charge, i.e., outputs voltage, to a capacitor that is used to control a voltage controlled oscillator ("VCO") (24). The VCO (24) is a circuit that produces a signal that has a frequency proportional to an input control voltage. The VCO (24) sets the frequency of the output signal from the VCO (24).

The signal outputted from the VCO (24) serves as an input to a third clock divider (26). The third clock divider (26) functions in the same manner as the first and second clock dividers (16, 18). After dividing down the signal outputted from the VCO (24), the third clock divider (26) outputs a PLL clock signal, PLL_CLK.

PLL_CLK serves as an input to a multiplexor (28). The buffered SYS_CLK signal also serves as an input to the multiplexor (28). Depending on the state of a select input, SEL, the multiplexor (28) outputs the PLL_CLK or the buffered SYS_CLK signal as a multiplexed CORE_CLK signal (also referred to and shown in FIG. 1 as "CORE_CLK_1").

The multiplexed CORE_CLK signal is then buffered by a third buffer (30) and a fourth buffer (32). The fourth buffer (32) outputs the multiplexed/buffered CORE_CLK signal (also referred to and shown in FIG. 1 as "CORE_CLK_2") for use by a computer chip or other system component and the fourth buffer (32) also outputs the multiplexed/buffered CORE_CLK signal to an input of a header stage (34), which is in a feedback path to the input of the PLL (10).

The header stage (34) inputs the multiplexed/buffered CORE_CLK signal and outputs CORE_CLK, which, in turn, serves as the input to the second buffer (14). The function of the PLL (10) from the point when the second buffer (14) inputs CORE_CLK is described above.

One goal of a phased-lock loop and other clock generators is to be able to manipulate a clock cycle in order to find circuit paths that limit peak performance of a certain component. For example, to determine if a certain path on a microprocessor is failing, a PLL can lengthen or shorten the cycle time of a core clock signal while a test is executed.

Manipulating a core clock signal generated by a PLL to have a stretched or shortened clock cycle is done by introducing some phase difference between a system clock signal and a core clock signal. In other words, by not precisely aligning a system clock signal and a core clock signal, the PLL can output a signal that represents an elongated or a shortened signal that is the synthesis of the system clock signal and the core clock signal. Further, the manipulation of the PLL output introduces phase error to the PFD input because the phase difference between the system clock signal and the core clock signal is fed back in the function of the PLL. The dominant resultant phase error, or noise, appears as phase noise ("jitter") on the output signal from the PLL. Moreover, such phase noise can cause the PLL to go out of lock.

SUMMARY OF INVENTION

In one aspect, a clock multiplexor stage comprises a multiplexor stage that inputs a clock signal at a first input thereof and a delay element that inputs the clock signal and outputs a delayed clock signal to a second input of the multiplexor. Therefrom, a select input on the multiplexor switches between the clock signal and the delayed clock signal to generate a stretched or shortened clock cycle at the output of the multiplexor stage. Those skilled in the art will appreciate that in alternative embodiments, a clock multiplexor stage can output a plurality of clock cycles and/or clock phases that are stretched, shortened, or a combination thereof.

In another aspect, a clock generator comprises a first clock multiplexor stage that inputs a first intermediary clock signal and outputs a first multiplexed clock signal, a second clock multiplexor stage that inputs a second intermediary clock signal and outputs a second multiplexed clock signal, a phase detector stage that inputs the first multiplexed clock signal and the second multiplexed clock signal and outputs an aligned clock signal to a third frequency divider that generates a third clock signal, and a third clock multiplexor stage that inputs the third clock signal and outputs the second clock signal.

In another aspect, a method for stretching and shortening a clock cycle comprises inputting a clock signal to an input of a multiplexor, inputting the clock signal to a first delay element, generating a first delayed clock signal from the first delay element to a second input of the multiplexor, and selectively switching the multiplexor from selecting the clock signal to selecting the first delayed clock signal such that the multiplexor generates a stretched clock cycle on an output of the multiplexor. Those skilled in the art will appreciate that in alternative embodiments, a plurality of clock cycles and/or clock phases can be generated that are stretched, shortened, or a combination thereof.

In another aspect, a method for generating a clock generator signal comprises inputting a first intermediary clock signal to a first clock multiplexor stage that generates a first multiplexed clock signal, wherein the first intermediary clock signal is based on a first clock signal, inputting a second intermediary clock signal to a second clock multiplexor stage that generates a second multiplexed clock signal, wherein the second intermediary clock signal is based on a second clock signal, generating a third clock signal based on phases and frequencies of the first multiplexed clock signal and the second multiplexed clock signal, inputting the third clock signal to a third clock multiplexor stage, and outputting the second clock signal.

In another aspect, a method for removing a clock cycle at an output of a multiplexor stage comprises selectively switching between either a normal clock signal or a delayed clock signal and a grounded signal.

Other aspects and advantages of the invention will be apparent from the following description and the appended claims.

BRIEF DESCRIPTION OF DRAWINGS

FIG. 1 shows a prior art embodiment of a clock generator.

FIG. 2 shows a block diagram of a clock generator in accordance with an embodiment of the present invention.

DETAILED DESCRIPTION

Figure 3:
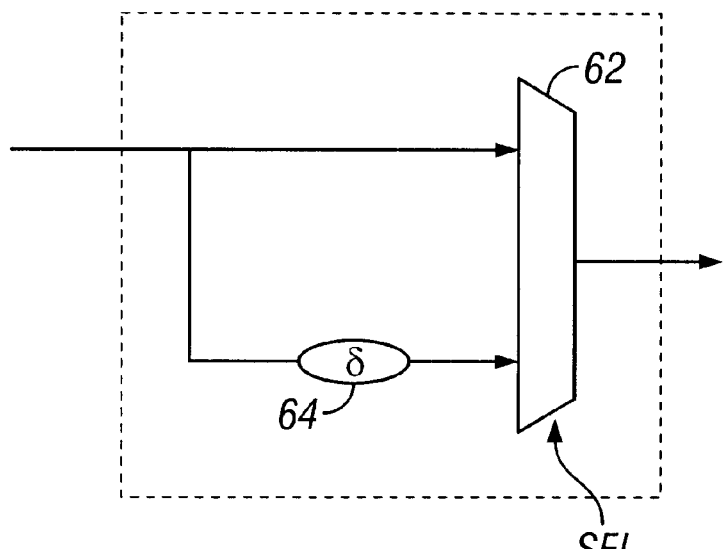
FIG. 3 shows a component of a clock generator in accordance with an embodiment of the present invention.

The design and testing of computer chips involve determining failure paths that decrease, and in many instances, severely affect chip performance. Such failure paths serve are a bottleneck to peak processor performance, and are therefore often referred to as "critical paths." The present invention provides an approach and method to facilitate the determining and remedying of critical paths. The present invention also relates to a method for stretching and/or shortening a clock cycle. The present invention also relates to a method for stretching and/or shortening successive clock cycles. The present invention also relates to a method for manipulating a clock cycle of an output signal from a clock generator without introducing phase error to the clock generator. The present invention also relates to an apparatus for stretching and/or shortening a clock cycle. The present invention also relates to an apparatus for stretching and/or shortening successive clock cycles. The present invention also relates to an apparatus for determining and remedying critical paths on a computer chip. Further, the present invention relates to a method and apparatus for removing one or more clock cycles.

Referring to FIG. 2, a clock generator in accordance with an exemplary embodiment of the present invention is shown. The clock generator (35) includes a first buffer (37) that inputs a system clock, SYS_CLK. The first buffer (37) restores SYS_CLK to "full swing" such that any voltage dissipation or stray voltage addition to SYS_CLK present at the input of the first buffer (37) is removed at the output of the first buffer (37).

The clock generator (35) also includes a second buffer (39) that inputs a core clock signal, CORE_CLK. The second buffer (39) restores CORE_CLK, in essentially the same manner as the first buffer (37) restores SYS_CLK.

Those skilled in the art will appreciate that in other embodiments of the present invention, the first buffer (37) and the second buffer (39) may each input differential signals, e.g., complementary input signals.

The first buffer (37) outputs the restored (also referred to as "buffered") SYS_CLK signal to a first clock divider (36) and the second buffer (39) outputs the restored (also referred to as "buffered") CORE_CLK signal to a second clock divider (38). The first clock divider (36) contains dividers and/or counters that divide SYS_CLK down, i.e., SYS_CLK's frequency decreases. As opposed to the first clock divider (36), which resides in a feed forward path of the clock generator (35), the second clock divider (38) resides in a feedback path of the clock generator (35). Accordingly, the second clock divider (38) divides down CORE_CLK. However, those skilled in the art will appreciate that because the second clock divider (38) resides in the feedback path of the clock generator (35), the dividing down of CORE_CLK actually results in the multiplying of CORE_CLK, i.e., CORE_CLK's frequency increases.

The divided SYS_CLK signal generated by the first clock divider (36) serves as an input to a first clock multiplexor stage (40) and the divided CORE_CLK signal generated by the second clock divider (38) serves as an input to a second clock multiplexor stage (42) (the divided SYS_CLK signal and the divided CORE_CLK signal are also referred to as "intermediary clock signals"). The function and operation of the first clock multiplexor stage (40) and the second clock multiplexor stage (42) is described below with reference to FIG. 3.

The first clock multiplexor stage (40) outputs a multiplexed SYS_CLK signal (also referred to as "first multiplexed clock signal") and the second clock multiplexor stage (42) outputs a multiplexed CORE_CLK signal (also referred to as "second multiplexed clock signal"). The multiplexed SYS_CLK signal and the multiplexed CORE_CLK signal generated by the first clock multiplexor stage (40) and the second clock multiplexor stage (42), respectively, serve as inputs to a phase-frequency detector ("PFD") (44).

The PFD (44) contains a device that produces two output pulses (not shown). The difference in pulse widths between the two output pulses from the PFD (44) is proportional to the phase difference of the two input signals to the PFD (44). The two output pulses produced by the PFD (44) then serve as inputs to a charge pump ("CP") (46). The CP (46), depending on the difference in pulse widths between its inputs, precharges or dumps charge, i.e., outputs voltage, to a capacitor that is used to control a voltage controlled oscillator ("VCO") (48).

The VCO (48) is a circuit that produces a signal that has a frequency proportional to an input control voltage. The VCO (48) sets the frequency of the output signal from the VCO (48). The PFD (44), CP (46), and VCO (48) form a phase detector stage.

The signal outputted from the VCO (48) serves as an input to a third clock divider (50). The third clock divider (50) functions in the same manner as the first and second clock dividers (36, 38). After dividing down the signal outputted from the VCO (48), the third clock divider (50) outputs a PLL clock signal, PLL_CLK.

PLL_CLK serves as an input to a third clock multiplexor stage (52). The third clock multiplexor stage (52) outputs a second multiplexed CORE_CLK signal (also referred to and shown in FIG. 2 as "CORE_CLK_1")

The second multiplexed CORE_CLK signal is then buffered by a third buffer (54) and a fourth buffer (56). The fourth buffer (56) outputs the multiplexed/buffered CORE_CLK signal (also referred to and shown in FIG. 2 as "CORE_CLK_2") for use by a computer chip or other system component and the fourth buffer (56) also outputs the multiplexed/buffered CORE_CLK to an input of a header stage (58), which is in a feedback path to the input of the clock generator (35).

The header stage (58) inputs the multiplexed/buffered CORE_CLK signal and outputs CORE_CLK, which, in turn, serves as the input to the second buffer (39). The function of the clock generator (35) from the point when the second buffer (39) inputs CORE_CLK is described above.

Referring to FIG. 3, a clock multiplexor stage of an exemplary embodiment of the present invention is shown. The clock multiplexor stage (60) shown in FIG. 3 has a similar configuration and function as the clock multiplexor stages (40, 42, 52) shown in FIG. 2. An input to the clock multiplexor stage (60), INPUT, serves as an input to a multiplexor (62) and also serves as an input to a delay element (64). The delay element (64) inputs the input signal to the clock multiplexor stage (62) and outputs a delayed signal, DELAY, to an input of the multiplexor (62) that is delayed by $\partial$ with respect to the input signal. Then, based on whether a select input, SEL, to the multiplexor (62) selects INPUT or DELAY, the multiplexor outputs an output signal, OUTPUT. Those skilled in the art will appreciate that the amount of delay, $\partial$, represented by the delay element (64) is programmable and can be changed by a user or a system as desired. Those skilled in the art will also appreciate that in other embodiments of the present invention, the multiplexor (62) may input, among other signals, a system clock signal, a connection to ground (to remove a clock cycle at the output), or a connection to a high voltage ("$V_{DD}$").

Typically, under normal operation, the clock multiplexor stage (60) selects, via SEL on the multiplexor (62), either INPUT or DELAY, such that the selected signal continuously passes from an input of the multiplexor (62) to the output of the clock multiplexor stage (62). When a clock generator needs to produce a stretched clock cycle with respect to a clock cycle of the input signal to the clock multiplexor stage (60), the multiplexor (62), via SEL, switches from selecting INPUT to DELAY. As will be shown in FIG. 4, switching SEL to select from INPUT to DELAY causes a stretched clock cycle to be produced at the output of the clock multiplexor stage (60).

Alternatively, when a clock generator needs to produce a shortened clock cycle with respect to a clock cycle of the input signal to the clock multiplexor stage (60), the multiplexor (62), via SEL, switches from selecting DELAY to INPUT. As will be shown in FIG. 4, switching SEL from DELAY to INPUT causes a shortened clock cycle to be produced at the output of the clock multiplexor stage (60).

Figure 4:
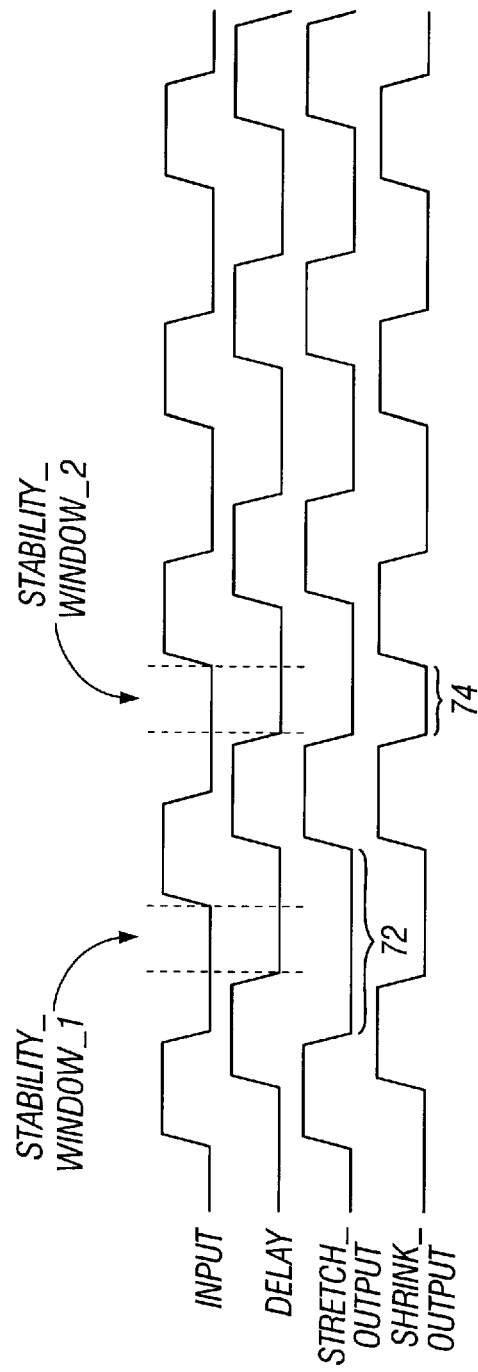
FIG. 4 shows an exemplary timing diagram in accordance with the embodiment shown in FIG. 3.

FIG. 4 shows an exemplary timing diagram of a function of the clock multiplexor stage (60) in accordance with the embodiment shown in FIG. 3. FIG. 4 shows, among other signals, an input signal, INPUT, to the clock multiplexor stage (60). FIG. 4 also shows a delayed signal, DELAY, which is delayed with respect to INPUT. Those skilled in the art will appreciate that the amount that DELAY is delayed by with respect to INPUT can be modified according to user and/or system requirements.

Under normal operation, the output of the clock multiplexor stage (60) takes on the behavior of either INPUT or DELAY depending upon which input is selected on the multiplexor (62) at the output of the clock multiplexor stage (60). When a stretched clock cycle needs to be produced at the output of the clock multiplexor stage (60), the select input, SEL, on the multiplexor (62) at the output of the clock multiplexor stage (60) must switch from selecting INPUT to DELAY. The change in selection occurs when the inputs, INPUT and DELAY, to the multiplexor (62) are stable, i.e., when inputs are not in transition from high to low or low to high. In STABILITY_WINDOW_1 shown in FIG. 4, both INPUT and DELAY are low, and therefore, both inputs to the multiplexor (62) are stable. In STABILITY_WINDOW_1, the select input switches from selecting INPUT to DELAY at the input of the multiplexor (62) causing the output signal, STRETCH_OUTPUT, from the multiplexor (62) to switch from INPUT to DELAY. Since INPUT was selected before the switch from INPUT to DELAY, INPUT passed to STRETCH_OUTPUT before the select switch. When the select input to the multiplexor (62) switches from INPUT to DELAY, DELAY passes to STRETCH_OUTPUT. As seen in FIG. 4, this causes STRECTH_OUTPUT to have a stretched clock cycle (72). Those skilled in the art will appreciate that in other embodiments of the present invention, the stability window might occur when both inputs, INPUT and DELAY, are high, thus causing the stretched cycle to occur on the high phase of a stretched output clock cycle.

When a shortened clock cycle needs to be produced at the output of the clock multiplexor stage (60), the select input, SEL, on the multiplexor (62) at the output of the clock multiplexor stage (60) must switch from selecting DELAY to INPUT. The change in selection occurs when the inputs, INPUT and DELAY, to the multiplexor (62) are stable. In STABILITY_WINDOW_2 shown in FIG. 4, both INPUT and DELAY are low, and therefore, both inputs to the multiplexor (62) are stable. In STABILITY_WINDOW_2, the select input switches from selecting DELAY to INPUT at the input of the multiplexor (62) causing the output signal, SHRINK_OUTPUT, from the multiplexor (62) to switch from DELAY to INPUT. Since DELAY was selected before the switch from DELAY to INPUT, DELAY passed to SHRINK_OUTPUT before the select switch. When the select input to the multiplexor (62) switches from DELAY to INPUT, INPUT passes to SHRINK_OUTPUT. As seen in FIG. 4, this causes SHRINK_OUTPUT to have a shortened clock cycle (74). Those skilled in the art will appreciate that in other embodiments of the present invention, the stability window might occur when both inputs, INPUT and DELAY, are high, thus causing the shortened cycle to occur on the high phase of a shortened output clock cycle.

Referring back to FIG. 2, the first and second clock multiplexor stages (40, 42) are used in the clock generator (35) to selectively match the delay (either a stretch delay or a shrink delay) introduced by a delay element in the third clock multiplexor stage (52). For example, if the third clock multiplexor stage (52) outputs a stretched clock cycle on CORE_CLK_1, then that stretched clock cycle on CORE_CLK 1, via CORE_CLK_2, also gets fed back to the input of the clock generator (35). Therefore, in order to avoid introducing phase error, i.e., noise, to the PFD (44), the first clock multiplexor stage (40) matches the stretch delay that is introduced by the third clock multiplexor stage (52) to avoid introducing phase error to the reference input of the PFD (44). Similarly, in the case that the third clock multiplexor stage (52) outputs a shortened clock cycle on CORE_CLK_1, the first clock multiplexor stage (40) matches the shrink delay that is introduced by the third clock multiplexor stage (52) to avoid introducing phase error to the reference input of the PFD (44). Further, when the first clock multiplexor stage (40) is used to emulate delays caused by the third clock multiplexor stage (52), the second clock multiplexor stage (42) is used to match delays caused by the first clock multiplexor stage (40) so that SYS_CLK is aligned with CORE_CLK.

Those skilled in the art will appreciate that in other embodiments, instead of using the first clock multiplexor stage (40) to match delays caused by the third clock multiplexor stage (52), the second clock multiplexor stage (42) may be used to match delays introduced by the third clock multiplexor stage (52). In this case, the second clock multiplexor stage (42) introduces a delay which is the negative, i.e., the inverse, of the delay caused by the third clock multiplexor stage (52). This is necessary because the second clock multiplexor stage (42) lies in a feed back path of the clock generator (35). For example, if the third clock multiplexor stage (52) stretches (adds delay) a CORE_CLK_1 cycle, then the second clock multiplexor stage (42) takes away delay, using a null delay, from CORE_CLK. Alternatively, if the third clock multiplexor stage (52) shrinks a CORE_CLK_1 cycle, then the second clock multiplexor stage (42) adds delay to CORE_CLK.

In the case that the third clock multiplexor stage (52) grounds an output cycle, a rising edge on CORE_CLK_1 is lost. Since CORE_CLK_1, via CORE_CLK_2, gets fed back to the input of the clock generator and since the PFD (44) typically detects rising edges, the clock generator (35) employs a compensation function by which the second clock multiplexor stage (42) outputs a rising edge by selecting, via a select input, a high voltage ("$V_{DD}$") at an input of a multiplexor at the output of the second clock multiplexor stage (42).

Figure 5:
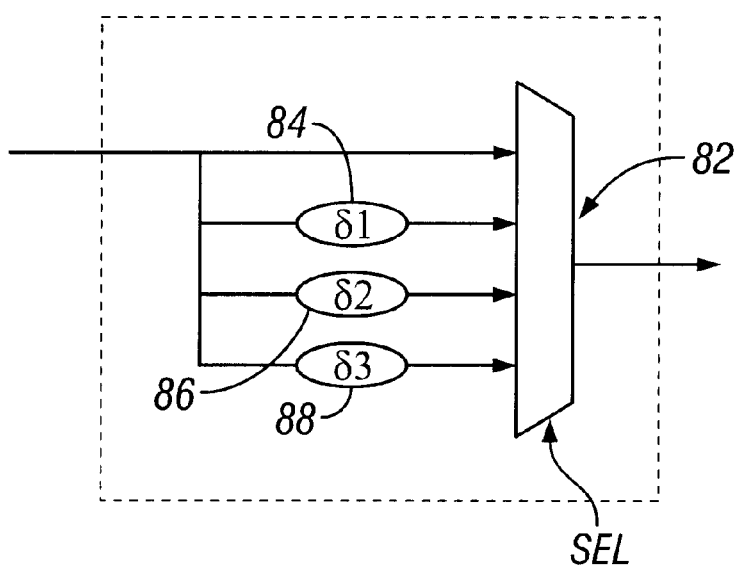
FIG. 5 shows a component of a clock generator in accordance with another embodiment of the present invention.

Those skilled in the art will also appreciate that in other embodiments of the present invention, a clock generator can manipulate successive clock cycles. FIG. 5 shows a clock multiplexor stage (80) that is capable of manipulating, i.e., stretching or shortening, successive clock cycles in accordance with an exemplary embodiment of the present invention. An input signal, INPUT, to the clock multiplexor stage (80) serves as an input to a multiplexor (82) and also serves as an input to a first delay element, $\partial$ 1 (84), a second delay element, $\partial$ 2 (86), and a third delay element, $\partial$ 3 (88). The third delay element (88) is longer than the second delay element (86), and the second delay element (86) is longer than the first delay element (88). Those skilled in the art will appreciate that the delay differences between a plurality of delay elements may be incremental or random. Those skilled in the art will also appreciate that the amount of delay represented by a delay element (84, 86, 88) is programmable and can be changed by a user or a system as desired. Further, those skilled in the art will appreciate that other embodiments may use a different number of delay elements.

The first, second, and third delay elements (84, 86, 88) output a first delayed signal ("DELAY_1"), a second delayed signal ("DELAY_2"), and a third delayed signal ("DELAY_3"), respectively, to inputs of the multiplexor (82). A select input, SEL, on the multiplexor (82) selects an input of the multiplexor (82) such that the signal at the selected input passes to the output, OUTPUT, of the clock multiplexor stage (80). Those skilled in the art will appreciate that in other embodiments of the present invention, the multiplexor (82) may input, among other signals, a system clock signal, a connection to ground (to remove a clock cycle at the output), or a connection to a high voltage ("$V_{DD}$").

Typically, under normal operation, the clock multiplexor stage (80) selects, via SEL on the multiplexor (82), either INPUT, DELAY_1, DELAY_2, or DELAY_3 such that the selected signal continuously passes from an input of the multiplexor (82) to OUTPUT. When a clock generator needs to produce successive stretched clock cycles with respect to clock cycles of an input signal to the multiplexor (82) that the clock multiplexor stage (80) is outputting, the multiplexor (82), via SEL, switches from selecting the input signal on the multiplexor (82) that is being outputted to successive subsequent delayed signals that have successively longer delay elements. For example, as will be shown in FIG. 6, selectively switching SEL to select from INPUT to DELAY_1, then from DELAY_1 to DELAY_2, and then from DELAY_2 to DELAY_3 causes successive stretched clock cycles to be produced at OUTPUT.

Alternatively, when a clock generator needs to produce successive shortened clock cycles with respect to clock cycles of an input signal to the multiplexor (82) that the clock multiplexor stage (80) is outputting, the multiplexor (82), via SEL, switches from selecting the input signal on the multiplexor (82) that is being outputted to successive delayed signals that have successively shorter delay elements.

Figure 6:
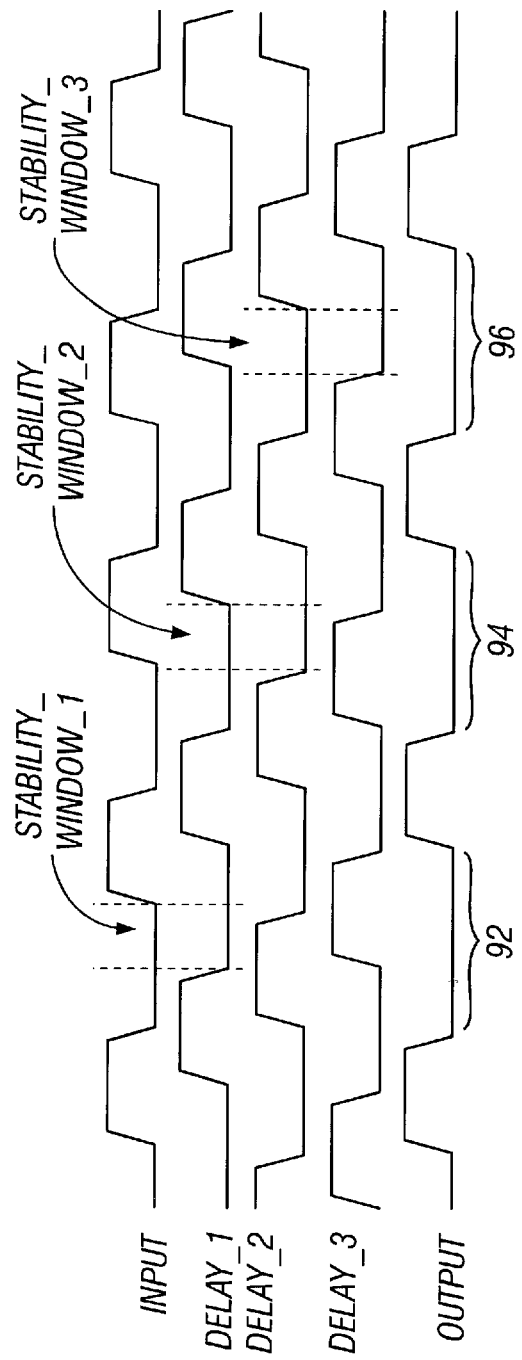
FIG. 6 shows an exemplary timing diagram in accordance with the embodiment shown in FIG. 5.

FIG. 6 shows an exemplary timing diagram of a function of the clock multiplexor stage (80) shown in FIG. 5. More particularly, FIG. 6 illustrates the function of producing successive stretched clock cycles. FIG. 6 shows, among other signals, the input signal, INPUT, to the clock multiplexor stage (80) and the output signal, OUTPUT, from the clock multiplexor stage (80). FIG. 6 also shows delayed signals, DELAY_1, DELAY_2, and DELAY_3, which are delayed with respect to INPUT. Those skilled in the art will appreciate that the amount that DELAY_1, DELAY_2 and DELAY_3 are delayed by with respect to INPUT can be modified according to user and/or system requirements.

In the exemplary timing diagram shown in FIG. 6, DELAY_1 is delayed by a quarter cycle with respect to INPUT. DELAY_2 is delayed by a half cycle with respect to INPUT. DELAY_3 is delayed by three quarters of a cycle with respect to INPUT. The delays in DELAY_1, DELAY_2, and DELAY_3 are based on values of the delay elements $\partial 1$, $\partial 2$, and $\partial 3$ in FIG. 5.

Referring to FIG. 5, SEL selects INPUT such that the input signal to clock multiplexor stage (80) passes to OUTPUT. Referring now to FIG. 6, in STABILITY_WINDOW_1, both INPUT and DELAY_1 are low, and therefore INPUT and DELAY_1 in FIG. 5 are said to be stable at their respective inputs to the multiplexor (82). Since INPUT and DELAY_1 are both stable at their respective inputs to the multiplexor (82) in STABILITY_WINDOW_1, SEL switches from selecting INPUT to DELAY_1. Accordingly, this causes the signal that passes to OUTPUT to change from INPUT to DELAY_1. As shown in FIG. 6, switching the signal that passes to OUTPUT produces a first stretched clock cycle (92) on OUTPUT.

Referring to FIGS. 6, in STABILITY_WINDOW_2, both DELAY_1 and DELAY_2 are low, and therefore DELAY_1 and DELAY_2 in FIG. 5 are said to be stable at their respective inputs to the multiplexor (82). Since DELAY_1 and DELAY_2 are both stable at their respective inputs to the multiplexor (82) in STABILITY_WINDOW_2, SEL switches from selecting DELAY_1 to DELAY_2. Accordingly, this causes the signal that passes to OUTPUT to change from DELAY_1 to DELAY_2. As shown in FIG. 6, switching the signal that passes to OUTPUT produces a second stretched clock cycle (94) on OUTPUT.

Referring to FIGS. 6, in STABILITY_WINDOW_3, both DELAY_2 and DELAY_3 are low, and therefore DELAY_2 and DELAY_3 in FIG. 5 are said to be stable at their respective inputs to the multiplexor (82). Since DELAY_2 and DELAY_3 are both stable at their respective inputs to the multiplexor (82) in STABILITY_WINDOW_3, SEL switches from selecting DELAY_2 to DELAY_3. Accordingly, this causes the signal that passes to OUTPUT to change from DELAY_2 to DELAY_3. As shown in FIG. 6, switching the signal that passes to OUTPUT produces a third stretched clock cycle (96) on OUTPUT. Further, those skilled in the art will appreciate that by applying the procedure for generating a plurality of stretched clock cycles described above with reference to FIG. 6, any number of stretched clock cycles may be generated.

Those skilled in the art will appreciate that in other embodiments of the present invention, a clock multiplexor stage can produce successive shortened clock cycles by selectively switching to signals that have successively smaller delays.

Those skilled in the art will also appreciate that in other embodiments of the present invention, stability windows might occur on the high phase, meaning that a select input on a multiplexor can selectively switch when certain inputs to the multiplexor are high. Additionally, those skilled in the art will appreciate that in other embodiments of the present invention, a clock multiplexor stage can output successive clock cycles that are stretched, shortened, or a combination thereof. Furthermore, those skilled in the art will appreciate that in other embodiments of the present invention, a clock multiplexor stage can output successive clock phases that are stretched, shortened, or a combination thereof.

Advantages of the present invention may include one or more of the following. In one or more embodiments, a critical path on a computer chip or other computer system component can be determined and remedied by stretching or shortening a clock cycle.

Additionally, in other embodiments, a clock generator can manipulate, i.e., stretch or shorten, a clock cycle without introducing phase error, i.e., noise, to the clock generator. This ensures that the output signal of the clock generator is stable.

In other embodiments, a clock generator can produce a clock signal that has a single stretched clock cycle or a plurality of successive stretched clock cycles.

Alternatively, a clock generator can produce a clock signal that has a single shortened clock cycle or a plurality of successive shortened clock cycles.

Further, in other embodiments, a clock generator can produce a clock signal that has a single removed clock cycle or a plurality of removed clock cycles.

In one or more embodiments, a clock generator can produce a clock signal having a single stretched clock cycle, a single shortened clock cycle, a plurality of successive stretched clock cycles, a plurality of successive shortened clock cycles, or any combination thereof.

In other embodiments, a clock generator has one or more delay elements that are programmable. This is advantageous because by being able to program a delay element, a user or a system component may designate when a stretched, or shortened clock cycle should occur and for how long the stretched or shortened clock cycle should occur.

In alternative embodiments, a multiplexor at the output of a clock generator has a select input that is programmable allowing a user or a system component to manipulate clock signal at the output of the clock generator.

Additionally, in other embodiments, a clock generator can produce a stretched or shortened clock cycle on either or both the high phase and the low phase on an output clock signal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A clock generator, comprising:
   a first clock multiplexor stage that inputs a first intermediary clock signal and outputs a first multiplexed clock signal;
   a second clock multiplexor stage that inputs a second intermediary clock signal and outputs a second multiplexed clock signal, wherein the second intermediary clock signal is dependent on an output of the clock generator;
   a phase detector stage that inputs the first multiplexed clock signal and the second multiplexed clock signal and outputs an aligned clock signal to a first frequency divider that generates a third intermediary clock signal; and a third clock multiplexor stage that inputs the third intermediary clock signal and outputs the clock generator output.

2. The clock generator of claim 1, wherein the first clock signal is a system clock signal, and wherein the clock generator output is a core clock signal.

3. The clock generator of claim 1, wherein the phase detector stage aligns a phase and a frequency of the second multiplexed clock signal with the first multiplexed clock signal.

4. The clock generator of claim 1, wherein the first clock multiplexor stage selectively matches delays generated by the third clock multiplexor stage.

5. The clock generator of claim 1, wherein the second clock multiplexor stage selectively matches delays generated by the third clock multiplexor stage.

6. The clock generator of claim 1, further comprising:
a second frequency divider that inputs a first clock signal and generates the first intermediary clock signal; and
a third frequency divider that inputs a second clock signal and generates the second intermediary clock signal.

7. The clock generator of claim 6, wherein the second clock signal is dependent on the output of the clock generator.

8. The clock generator of claim 1, wherein the aligned signal is representative of a synthesis between the first multiplexed clock signal and the second multiplexed clock signal.

9. The clock generator of claim 1, wherein the first clock multiplexor stage comprises:
a first multiplexor that inputs the first intermediary clock signal at a first input thereof, and
a first delay element that inputs the first intermediary clock signal and outputs a first delayed clock signal to a second input of the first multiplexor.

10. The clock generator of claim 9, wherein the first multiplexor inputs a grounded signal that is used to remove a clock cycle.

11. The clock generator of claim 9, wherein the first delay element is programmable.

12. The clock generator of claim 9, wherein a select input to the first multiplexor selectively switches from selecting the first intermediary clock signal to selecting the first delayed clock signal in order to output a stretched clock cycle, and wherein the select input to the first multiplexor selectively switches from selecting the first delayed clock signal to the first intermediary clock signal in order to output a shortened clock cycle.

13. The clock generator of claim 9, wherein the first clock multiplexor stage further comprises:
an additional delay element that inputs the first intermediary clock signal and outputs an additional delayed clock signal to a third input of the first multiplexor.

14. The clock generator of claim 13, wherein a select input to the first multiplexor selectively switches from selecting the first intermediary clock signal to selecting the first delayed clock signal to selecting the additional delayed clock signal in order to output a plurality of stretched clock cycles on the first multiplexed clock signal.

15. The clock generator of claim 14, wherein the select input to the first multiplexor selectively switches from selecting the additional delayed clock signal to selecting the first delayed clock signal to selecting the first intermediary clock signal in order to output a plurality of shortened clock cycles on the first multiplexed clock signal.

16. The clock generator of claim 1, wherein the second clock multiplexor stage comprises:

a second multiplexor that inputs the second intermediary clock signal at a first input thereof; and
a second delay element that inputs the second intermediary clock signal and outputs a second delayed clock signal to a second input of the second multiplexor.

17. The clock generator of claim 16, wherein the second clock multiplexor stage further comprises:
an additional delay element that inputs the second intermediary clock signal and outputs an additional delayed clock signal to a third input of the second multiplexor.

18. The clock generator of claim 17, wherein a select input to the second multiplexor selectively switches from selecting the second intermediary clock signal to selecting the second delayed clock signal to selecting the additional delayed clock signal in order to output a plurality of stretched clock cycles on the second multiplexed clock signal.

19. The clock generator of claim 18, wherein the select input to the second multiplexor selectively switches from selecting the additional delayed clock signal to selecting the second delayed clock signal to selecting the second intermediary clock signal in order to output a plurality of shortened clock cycles on the second multiplexed clock signal.

20. The clock generator of claim 16, wherein a select input to the second multiplexor selectively switches from selecting the second intermediary clock signal to selecting the second delayed clock signal in order to output a stretched clock cycle, and wherein the select input to the second multiplexor selectively switches from selecting the second delayed clock signal to the second intermediary clock signal in order to output a shortened lock cycle.

21. The clock generator of claim 16, wherein the second delay element is programmable.

22. The clock generator of claim 16, wherein the second multiplexor inputs a grounded signal that is used to remove a clock cycle.

23. The clock generator of claim 1, wherein the third clock multiplexor stage comprises:
a third multiplexor that inputs the third intermediary clock signal at a first input thereof; and
a third delay element that input the third intermediary clock signal and outputs a third delayed clock signal to a second input of the third multiplexor.

24. The clock generator of claim 23, wherein a select input to the third multiplexor selectively switches from selecting the third intermediary clock signal to selecting the third delayed clock signal in order to output a stretched clock cycle, and wherein the select input to the third multiplexor selectively switches from selecting the third delayed clock signal to selecting the third intermediary clock signal in order to output a shortened clock cycle.

25. The clock generator of claim 23, wherein the third delay element is programmable.

26. The clock genera or of claim 23, wherein the third multiplexor inputs a grounded signal that is used to remove a clock cycle.

27. The clock generator of claim 23, wherein the third clock multiplexor stage further comprises:
an additional delay element that inputs the third intermediary clock signal and outputs an additional delayed clock signal to a third input of the third multiplexor.

28. The clock generator of claim 27, wherein a select input to the third multiplexor selectively switches from selecting the third intermediary clock signal to the third delayed clock signal to selecting the additional delayed clock signal in order to output a plurality of stretched clock cycles on the clock generator output.

29. The clock generator of claim 28, wherein the select input to the third multiplexor selectively switches from selecting the additional clock signal to selecting the third delayed clock signal to selecting the third intermediary clock signal in order to output a plurality of shortened clock cycles on the clock generator output.

30. A method for generating a clock generator signal, comprising:

inputting a first intermediary clock signal to a first clock multiplexor stage that generates a first multiplexed clock signal, wherein the first intermediary clock signal is based on a first clock signal;

inputting a second intermediary clock signal to a second clock multiplexor stage that generates a second multiplexed clock signal, wherein the second intermediary clock signal is based on a second clock signal;

generating a third clock signal based on phases and frequencies of the first multiplexed clock signal and the second multiplexed clock signal;

inputting the third clock signal to a third clock multiplexor stage; and outputting the second clock signal.

31. The method of claim 30, wherein a multiplexor within at least one selected from the group consisting of the first clock multiplexor stage, the second clock multiplexor stage, and the third clock multiplexor stage has an input connected to a grounded signal in order to selectively remove a clock cycle at an output of the multiplexor.

32. The method of claim 30, wherein the first clock multiplexor stage and the second clock multiplexor stage selectively match delays generated by the third clock multiplexor stage.

33. The method of claim 30, further comprising:

inputting the first multiplexed clock signal and the second multiplexed clock signal to a phase detector stage.

34. The method of claim 33, wherein the phase, detector stage aligns the first multiplexed clock signal with the second multiplexed clock signal.

35. The method of claim 30, wherein the second clock signal is the clock generator signal.

36. The method of claim 30, wherein the first clock signal is a system clock, and wherein the second clock signal is a core clock.

37. The method of claim 30, comprising, within the first clock multiplexor stage:

inputting the first intermediary clock signal to a first multiplexor at an input thereof;

inputting the first intermediary clock signal to a first delay element;

generating a first delayed clock signal from the first delay element; and applying the first delayed clock signal to a second input of the first multiplexor.

38. The method of claim 37, wherein the first delay element is programmable.

39. The method of claimed 37, further comprising:

selectively switching from selecting the first delayed clock signal to selecting the first intermediary clock signal; and generating a shortened clock cycle on an output of the first multiplexor.

40. The method of claim 37, further comprising:

selectively switching from selecting the first intermediary clock signal to selecting the first delayed clock signal; and generating a stretched clock cycle on an output from the first multiplexor.

41. The method of claim 37, further comprising, within the first clock multiplexor stage:

inputting the first intermediary clock signal to an additional delay element;

generating an additional delayed clock signal from the additional delay element; and applying the additional delayed clock signal to a third input of the first multiplexor.

42. The method of claim 41, further comprising:

selectively switching from selecting the first intermediary clock signal to selecting the first delayed clock signal to selecting the additional delayed clock signal; and generating a plurality of stretched clock cycles on an output of the first multiplexor.

43. The method of claim 41, further comprising:

selectively switching from selecting the additional delayed clock signal to selecting the first delayed clock signal to selecting the first intermediary clock signal; and generating a plurality of shortened clock cycles on an output of the first multiplexor.

44. The method of claim 41, wherein the additional delay element is programmable.

45. The method of claim 30, comprising, within the second clock multiplexor stage:

inputting the second intermediary clock signal to a second multiplexor at an input thereof;

inputting the second intermediary clock signal to a second delay element;

generating a second delayed clock signal from the second delay element; and applying the second delayed clock signal to a second input of the second multiplexor.

46. The method of claim 45, wherein the second delay element is programmable.

47. The method of claim 45, further comprising:

selectively switching from selecting the second delayed clock signal to selecting the second intermediary clock signal; and generating a shortened clock cycle on an output of the second multiplexor.

48. The method of claim 45, further comprising:

selectively switching from selecting the second intermediary clock signal to selecting the second delayed clock signal; and generating a stretched clock cycle on an output of the second multiplexor.

49. The method of claim 45, further comprising, within the second clock multiplexor stage:

inputting the second intermediary clock signal to an additional delay element;

generating an additional delayed clock signal from the additional delay element; and applying the additional delayed clock signal to a third input of the second multiplexor.

50. The method of claim 49, further comprising:

selectively switching from selecting the second intermediary clock signal to selecting the second delayed clock signal to selecting the additional delayed clock signal; and generating a plurality of stretched clock cycles on an output of the second multiplexor.

51. The method of claim 49, further comprising:

selectively switching from selecting the additional delayed clock signal to selecting the second delayed clock signal to selecting the second intermediary clock signal; and generating a plurality of shortened clock cycles on an output of the second multiplexor.

52. The method of claim 49, wherein the additional delay element is programmable.

53. The method of claim 30, comprising, within the third clock multiplexor stage:

inputting the third clock signal to a third multiplexor at an input thereof;

inputting the third clock signal to a third delay element;

generating a third delayed clock signal from the third delay element; and applying the third delayed clock signal to a second input of the third multiplexor.

54. The method of claim 53, wherein the third delay element is programmable.

55. The method of claim 53, further comprising:

selectively switching from selecting the third delayed clock signal to selecting the third clock signal; and generating a shortened clock cycle on an output of the third multiplexor.

56. The method of claim 53, further comprising:

selectively switching from selecting the third clock signal to selecting the third delayed clock signal; and generating a stretched clock cycle on an output of the third multiplexor.

57. The method of claim 53, further comprising, within the third clock multiplexor stage:

inputting the third clock signal to an additional delay element;

generating an additional delayed clock signal from the additional delay element; and applying the additional delayed clock signal to a third input of the third multiplexor.

58. The method of claim 57, further comprising:

selectively switching from selecting the third clock signal to selecting the third delayed clock signal to selecting the additional delayed clock signal; and generating a plurality of stretched clock cycles on an output of the third multiplexor.

59. The method of claim 57, further comprising:

selectively switching from selecting the additional delayed clock signal to selecting the third delayed clock signal to selecting the third clock signal; and generating a plurality of shortened clock cycles on an output of the third multiplexor.

60. The method of claim 57, wherein the additional delay element is programmable.

* * * * *

UNITED STATES PATENT AND TRADEMARK OFFICE
CERTIFICATE OF CORRECTION

PATENT NO. : 6,529,057 B2
DATED : March 4, 2003
INVENTOR(S) : Gin S. Yee

It is certified that error appears in the above-identified patent and that said Letters Patent is hereby corrected as shown below:

Column 12,
Line 56, replace "genera or" with -- generator --.

Column 13,
Line 58, replace "claimed" with -- claim --.

Signed and Sealed this

First Day of July, 2003

JAMES E. ROGAN
*Director of the United States Patent and Trademark Office*